INVENTOR
AKIO YAMASHITA

BY Stevens, Davis, Miller & Mosher
ATTORNEYS

INVENTOR
AKIO YAMASHITA

BY Stevens, Davis, Miller & Mosher
ATTORNEYS 3,437,891
Patented Apr. 8, 1969

3,437,891

SEMICONDUCTOR DEVICES

Akio Yamashita, Ikeda-shi, Japan, assignor to Matsushita Electric Industrial Co., Ltd., Osaka, Japan, a corporation of Japan Continuation of application Ser. No. 494,500, Oct. 11, 1965. This application Oct. 9, 1967, Ser. No. 674,017
Claims priority, application Japan, Oct. 17, 1964, 39/59,387; June 29, 1965, 40/39,607
Int. Cl. H01l *11/04*
U.S. Cl. 317—235 2 Claims

ABSTRACT OF THE DISCLOSURE

A semiconductor device capable of bidirectionally switching a large power with a small control power including two separate double diffused regions formed in one surface of a semiconductor substrate in such a manner that a p-n-p-n-p or a n-p-n-p-n structure is formed in the surface of the substrate, two electrodes provided on each of said double diffused regions, an insulating layer extending over the intermediate n-p-n or p-n-p regions of said p-n-p-n-p or n-p-n-p-n structure, and a control electrode on said insulating layer.

This application is a continuation of application, Ser. No. 494,500, filed Oct. 11, 1965, which is now abandoned.

The present invention relates to a semiconductor device which can control switching function through an insulator, and more particularly to a semiconductor device which can effect bilateral switching of a large power with a small control power.

Heretofore, as semiconductor devices which effect bilateral switching, symmetrical silicon switching elements having a structure of pnpnp or npnpn have been known. Such an element is a two-terminal element having a bilateral negative resistance, and has been utiilzed as a switch. However, having no control electrode, such element can not be varied in its turn-on voltage.

An object of the persent invention is to eliminate the above-mentioned disadvantages and to provide semiconductor devices which can effect the switching of a large power with a small control power.

Other objects and advantages of the present invention will become more apparent from the following detailed description when taken in conjunction with the accompanying drawings, in which.

Figure 1:
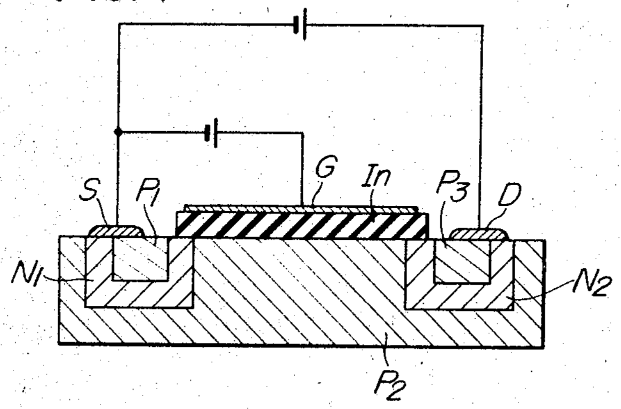
FIG. 1 is a structural diagram illustrating a principle of the device according to the present invention.

Now referring to FIG. 1, n-type regions $N_1$ and $N_2$ are formed separately in one surface of p-type region $P_2$, and further p-type regions $P_1$ and $P_3$ are formed respectively in the regions $N_1$ and $N_2$. An electrode S is attached to the regions $P_1$ and $N_1$ extending thereover, and likewise an electrode D is formed on the regions $P_3$ and $N_2$ extending thereover. On the regions $N_1$, $P_2$, and $N_2$ is provided an insulator layer $I_n$ extending thereover, on which insulator further an electrode G is formed.

Now if D.C. voltages are applied between the electrodes S and D and between the electrodes S and G as shown in FIG. 1, between the regions $P_2$–$N_1$ and between the regions $P_3$–$N_2$ forward biases are developed, and between the regions $N_1$–$P_1$ and between the regions $N_2$–$P_2$ reverse biases are developed. The electrons injected from the region $N_1$ to the region $P_2$ pass through the channel directly under the insulator layer $I_n$ and are stored in the vicinity of the junction $P_2$–$N_2$, depressing the barrier of the junction $P_2$–$N_2$, and therefore between the electrodes S–D and "ON" state results.

If the control voltage is null, the voltage causing the "ON" state is high because of no formation of the channel, while when the control voltage is applied, the voltage causing the "ON" state becomes low.

Since the device according to the present invention is of the symmetrical construction such as PnPnP or nPnPn and has no polarity, the same situation holds even if the bias is reversed in FIG. 1. Therefore, an A.C. switch capable of controlling a turn-on voltage is obtained.

Figure 2:
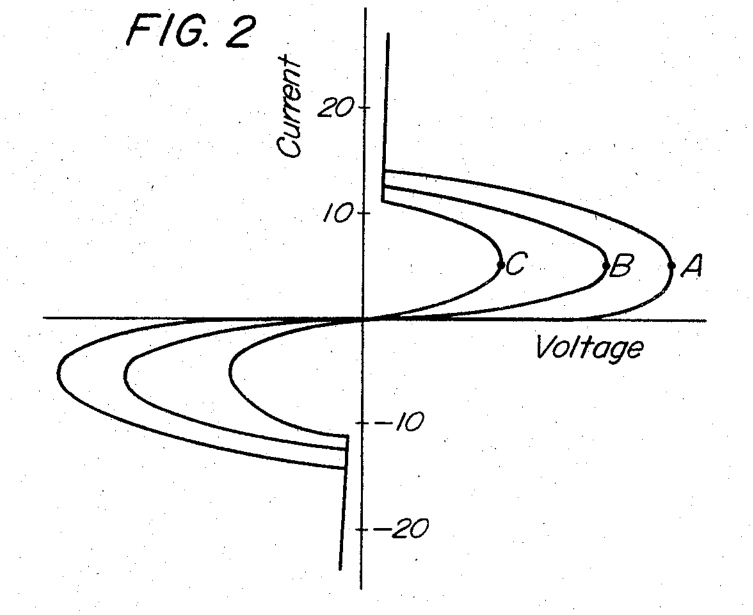
FIG. 2 is a diagram showing the voltage vs. current characteristics of an embodiment of the invention.

Now, let us turn to the description of an embodiment. P-type silicon having conductivity 20 Ω-cm. was doped with phosphorus through a $SiO_2$ mask by a well known method, and was further doped with boron through another $SiO_2$ mask. Subsequently $SiO_2$ was evaporated to the extent as shown in FIG. 1 to form an insulator layer. Electrodes have been formed with Al evaporated films. The voltage vs. current characteristics of the resulting device are shown in FIG. 2. As shown, negative resistance characteristics are symmetrical because of the symmetrical construction of the device, and the turn-on voltage thereof decreases to, such as, A, 60 v.; B, 44 v.; C, 23 v., as the control voltage increases.

As an embodiment, a device having the structure pnpnp has been described. The situation for a device of the structure npnpn is similar to that for pnpnp, and similar characteristics result.

Figure 3:
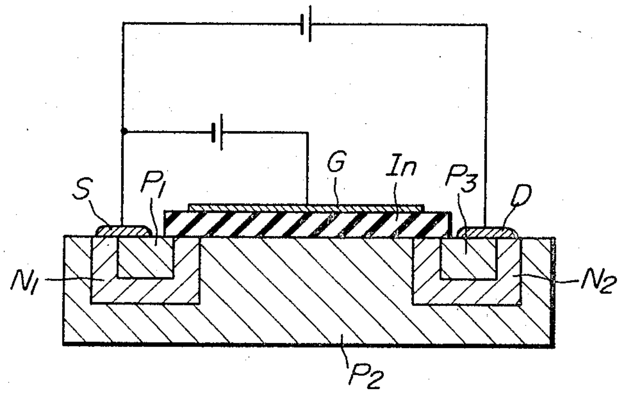
FIG. 3 is a structural diagram, similar to FIG. 1, in which the insulator layer is more extended.

Although the insulator layer $I_n$ is provided extending over the regions $N_1$–$P_2$–$N_2$ in FIG. 1, the essential features of the operation of the device is not changed even if the insulator layer is provided extending over the regions $P_1$–$N_1$–$P_2$–$N_2$–$P_3$ as shown in FIG. 3.

As has been stated, the device according to the present invention is capable of controlling a turn-on voltage, can be used as an A.C. switch with a small control power and therefore has a large industrial value.

What I claim is:

1. A semiconductor device comprising a semi-conductor substrate of one conductivity type, two separate first regions of opposite conductivity type formed in one surface of said substrate, two second regions of the same conductivity type as said one conductivity type formed respectively in said two first regions, two electrodes each electrically contacting one of said first and second regions, an insulator layer extending over at least part of said two separate first regions and the portion of said substrate lying between them, and a control electrode provided on said insulator layer extending over at least part of said two separate first regions and the portion of said substrate lying therebetween whereby control efficiency is improved.

2. A semiconductor device according to claim 1 in which that said insulator layer further extends over at least part of said two second regions.

References Cited

UNITED STATES PATENTS 3,206,670 9/1965 Atalla ............. 317—235

FOREIGN PATENTS 657,345 2/1963 Canada.
945,249 12/1963 Great Britain.

OTHER REFERENCES

Electronics, "Helpful transistor analog: 4-layer PN-PN≈2 transistors," by Stasior, Aug. 10, 1964, pp. 66 and 67.

JOHN W. HUCKERT, *Primary Examiner.*

A. J. JAMES, *Assistant Examiner.*

U.S. Cl. X.R.

317—234